United States Patent
Kim et al.

(10) Patent No.: US 8,993,423 B2
(45) Date of Patent: Mar. 31, 2015

(54) METHOD FOR MANUFACTURING SOLAR CELL

(71) Applicant: Shinshung Solar Energy Co., Ltd., Seongnam-si (KR)

(72) Inventors: Ji Soo Kim, Seongnam-si (KR); Ho Sik Kim, Yongin-si (KR); Ji Sun Kim, Incheon (KR); Jong Youb Lim, Cheongwon-gun (KR); Yeon Hee Hwang, Pohang-si (KR); Hoon Joo Choi, Pyeongtaek-si (KR); Jeong Jae Jo, Goesan-gun (KR)

(73) Assignee: Shinshung Solar Energy Co., Ltd., Seongnam-si (KR)

( * ) Notice: Subject to any disclaimer, the term of this patent is extended or adjusted under 35 U.S.C. 154(b) by 0 days.

(21) Appl. No.: 13/932,438

(22) Filed: Jul. 1, 2013

(65) Prior Publication Data

US 2014/0162395 A1 Jun. 12, 2014

(30) Foreign Application Priority Data

Jun. 29, 2012 (KR) .......................... 10-2012-0071202

(51) Int. Cl.
*H01L 31/065* (2012.01)
*H01L 31/0236* (2006.01)

(52) U.S. Cl.
CPC ........ *H01L 31/065* (2013.01); *H01L 31/02363* (2013.01); *Y02E 10/52* (2013.01)
USPC ................ 438/514; 438/71; 438/69; 438/87; 438/510

(58) Field of Classification Search
USPC ........................................... 438/71, 665, 964
See application file for complete search history.

(56) References Cited

U.S. PATENT DOCUMENTS

| | | | |
|---|---|---|---|
| 2009/0142875 A1* | 6/2009 | Borden et al. | 438/69 |
| 2010/0015750 A1* | 1/2010 | Shen et al. | 438/72 |
| 2013/0298975 A1* | 11/2013 | Yang et al. | 136/255 |

* cited by examiner

*Primary Examiner* — Mamadou Diallo
(74) *Attorney, Agent, or Firm* — The Webb Law Firm

(57) ABSTRACT

A method of manufacturing a solar cell is disclosed. The method includes forming a dielectric film on a semiconductor substrate doped with a first conductive type impurity, exposing a high concentration doping region of a predetermined selective emitter by partially removing the dielectric film, and ion-implanting a second conductive type impurity into a front surface of the semiconductor substrate with the dielectric film formed thereon to form a high concentration doping layer in the semiconductor substrate to correspond to the high concentration doping region and to form a low concentration doping layer in the semiconductor substrate to correspond to a region in which the dielectric film is formed.

4 Claims, 1 Drawing Sheet

METHOD FOR MANUFACTURING SOLAR CELL

BACKGROUND OF THE INVENTION

1. Field of the Invention

The present invention relates to a method of manufacturing a solar cell, and more particularly to a method of manufacturing a solar cell including a selective emitter.

2. Description of the Related Art

Recently, research into new renewable energy sources that can reduce environmental pollution has been actively conducted as problems in terms of environmental pollution are aggravated. Among these new renewable energy sources, in particular, solar cells, which produce electrical energy from sunlight, are receiving attention.

A solar cell, which is a photoelectric conversion element that directly converts sunlight into electrical energy, has a junction structure of p and n type semiconductors and a basic structure thereof is similar to that of a diode. Solar cells are classified into silicon solar cells and compound semiconductor solar cells according to their manufacturing materials and are classified into a substrate type and a thin-film type according to shapes thereof. Currently, a substrate-type crystalline silicon solar cell is widely used for solar power generation and includes a silicon substrate, an n-type layer that is disposed on a front surface of the silicon substrate and acts as an emitter, a p-type layer disposed on a rear surface of the silicon substrate, and a reflection preventing layer such as a silicon nitride film, an oxide film, or the like to minimize reflection of light.

Solar cells that are currently used mostly for industrial applications are manufactured using a screen-printing method and have a photoelectric conversion efficiency of approximately 15-18%. However, it is difficult to anticipate higher efficiency using currently used structures and manufacturing processes, and thus, development of a variety of structures and manufacturing processes is underway worldwide.

A selective emitter structure is one technique used to manufacture high-efficiency solar cells, and is configured such that only an electrode part of a solar cell is locally doped at a high concentration and the remaining part thereof (a part to absorb light) is doped at a low concentration, which gives the selective emitter structure advantages of both a high-concentration emitter layer and a low-concentration emitter layer.

To form a selective emitter, techniques such as laser scribing used for buried contact solar cells (BCSCs), photolithography used for passivated emitter rear locally (PERL) diffused cells, and the like have been developed. However, most of these techniques require a high-temperature process in two or more steps and thus manufacturing costs increase and production yield decreases.

Therefore, there is urgent need for high-efficiency crystalline silicon solar cells that do not require complicated manufacturing processes and can be mass-produced.

SUMMARY OF THE INVENTION

Therefore, the present invention has been made in view of the above problems, and it is an object of the present invention to provide a method of manufacturing a solar cell that may substantially obviate one or more problems caused by limitations and disadvantages of the related art.

It is another object of the present invention to provide a method of manufacturing a solar cell that does not require complicated manufacturing processes and enables formation of a selective emitter.

In accordance with the present invention, the above and other objects can be accomplished by the provision of a method of manufacturing a solar cell, the method including forming a dielectric film on a semiconductor substrate doped with a first conductive type impurity, exposing a high concentration doping region of a predetermined selective emitter by partially removing the dielectric film, and ion-implanting a second conductive type impurity into a front surface of the semiconductor substrate with the dielectric film formed thereon to form a high concentration doping layer in the semiconductor substrate to correspond to the high concentration doping region and to form a low concentration doping layer in the semiconductor substrate to correspond to a region in the dielectric film is formed.

The dielectric film may have a thickness of 10 to 30 nm.

The ion-implanting may be performed in an energy of 1 to 100 KeV and a concentration of $1\times10^{15}/cm^3$ to $1\times10^{19}/cm^3$.

The method may further include forming texturing by etching a surface of the semiconductor substrate before the forming.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, embodiments of the present invention will be described in detail with reference to the accompanying drawings.

When it is deemed that a detailed description of known functions or configurations may unnecessarily obscure the subject matter of the present invention, a detailed description thereof will be omitted. In addition, the following terms, which are defined in consideration of functions of the present invention, may be altered depending on user or operator intentions or judicial precedents. Therefore, the meaning of each term should be interpreted based on the overall disclosure of the specification.

Figure 1:
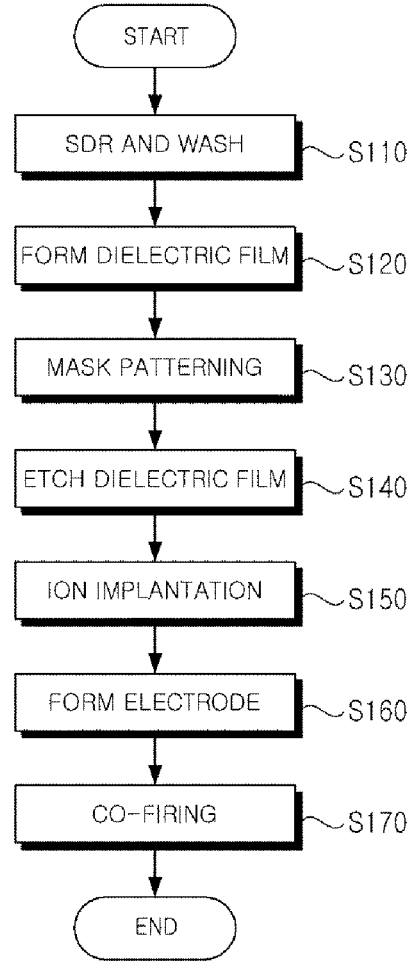
FIG. 1 is a flowchart for explaining a solar cell manufacturing method according to an embodiment of the present invention.
Figure 2:
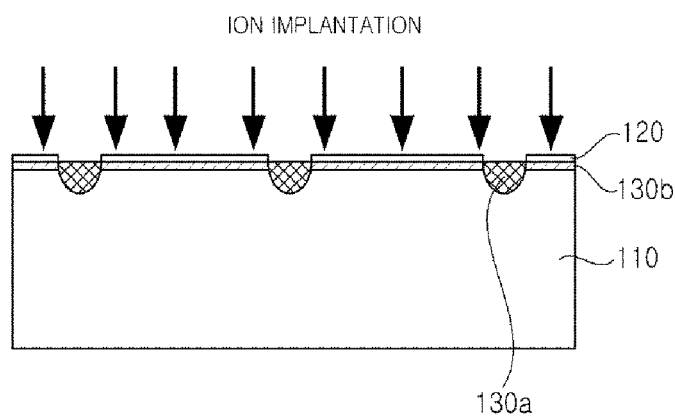
FIG. 2 is a sectional view for explaining an ion implantation process of the solar cell manufacturing method of FIG. 1.

FIG. 1 is a flowchart for explaining a solar cell manufacturing method according to an embodiment of the present invention. FIG. 2 is a sectional view for explaining an ion implantation process (operation S150) of the solar cell manufacturing method of FIG. 1.

Referring to FIG. 1, first, saw damage removal (SDR) and a washing process are performed to remove defects, impurities and the like generated when cutting a wafer (operation S110). In this regard, texturing may be performed on a surface of a semiconductor substrate. Texturing is a process of forming a textured surface with a plurality of protrusions by etching a front surface of a semiconductor substrate using a dry etching method such as reactive ion etching (RIE) or the like. Due to such texturing process, surface reflection loss may be reduced, light absorption may be increased by trapping of light, and loss of incident light may be minimized due to diffuse reflection.

Subsequently, a dielectric film formed of $SiO_2$, $SiN_x$, or the like is formed on a front surface of the semiconductor substrate (operation S120). In this regard, the dielectric film may have a thickness that enables some ions to penetrate therethrough and migrate into the semiconductor substrate disposed therebelow during a subsequent ion implantation process for forming a selective emitter, e.g., about 10 to about 30 nm, and the thickness of the dielectric film may be adjusted according to energy for ion implantation and doping degree.

Next, a mask pattern is formed on the dielectric film (operation S130). In this regard, the mask pattern is used as an etching mask for a subsequent process of etching the dielectric film and the mask pattern is formed so that portions of the dielectric film on high concentration doping regions of the selective emitter are exposed. In addition, the mask pattern may be formed using a general photolithography process.

Next, the dielectric film is etched using the mask pattern as an etching mask to expose portions of the semiconductor substrate, corresponding to the high concentration doping regions of the selective emitter (operation S140).

Next, an impurity of a different conductive type than the semiconductor substrate and having an energy of 1 to 100 KeV and a concentration of $1\times10^{15}/cm^3$ to $1\times10^{19}/cm^3$ is implanted into the semiconductor substrate (operation S150). As illustrated in FIG. 2, ions are implanted into regions that are not covered by the dielectric film, designated by reference numeral "120," i.e., high concentration doping regions 130$a$ of the semiconductor substrate, designated by reference numeral "110," whereas ions are not implanted into regions that are covered by the dielectric film 120, i.e., low concentration doping regions 130$b$ of the semiconductor substrate 110, due to the dielectric film 120. Accordingly, the high concentration doping regions 130$a$ and the low concentration doping regions 130$b$ may be simultaneously formed by performing ion implantation once. In addition, ion implantation energy and concentration may be appropriately adjusted if desired, and low concentration doping generally means an order of magnitude of $10^{15}/cm^3$ and high concentration doping generally means an order of magnitude of $10^{19}/cm^3$.

Next, electrodes contacting the selective emitter are formed after ion implantation (operation S160) and a co-firing process is performed (operation S170). In this regard, an emitter layer may be partially exposed to open emitter contact and a metal paste such as Al, Ag, AgAl, or the like may be coated on contact open regions using a metal screen-printing method, to form the electrodes.

As is apparent from the above description, according to a solar cell manufacturing method according to the present invention, a selective emitter having a high concentration doping layer and a low concentration doping layer is formed by performing ion implantation once using a dielectric film, whereby manufacturing processes may be simplified and suitability for mass production may be increased.

In addition, the solar cell may have increased photoelectric conversion efficiency and manufacturing costs may also be reduced.

Although the preferred embodiments of the present invention have been described in the detailed description and the accompanying drawings for illustrative purposes, it will be apparent to those skilled in the art that various substitutions, modifications, and variations can be made in the present invention without departing from the spirit or scope of the invention. Thus, the embodiments should not be construed as limiting the scope of the present invention and the scope of the invention should be interpreted to include the appended claims and their equivalents.

What is claimed is:

1. A method of manufacturing a solar cell, the method comprising:
   (a) forming a dielectric film on a front surface of a semiconductor substrate doped with a first conductive type impurity;
   (b) following step (a), exposing a high concentration doping region of a predetermined selective emitter by partially removing the dielectric film; and
   (c) following step (b), ion-implanting a second conductive type impurity into the front surface of the semiconductor substrate to form a high concentration doping layer in the semiconductor substrate to correspond to the high concentration doping region and to simultaneously form a low concentration doping layer in the semiconductor substrate to correspond to a region in which the dielectric film is formed without the use of a high-temperature process.

2. The method according to claim 1, wherein the dielectric film has a thickness of 10 to 30 nm.

3. The method according to claim 2, wherein the ion-implanting is performed in an energy of 1 to 100 KeV and a concentration of $1\times10^{15}/cm^3$ to $1\times10^{19}/cm^3$.

4. The method according to claim 1, further comprising, prior to step (a), texturing by etching the front surface of the semiconductor substrate.

* * * * *